United States Patent [19]

Morel et al.

[11] 4,389,703
[45] Jun. 21, 1983

[54] INTEGRATED VOLTAGE MULTIPLIER

[75] Inventors: Gilbert Morel; Pierre Frappart; Roland Saint Marcoux, all of Paris, France

[73] Assignee: Thomson-CSF, Paris, France

[21] Appl. No.: 233,122

[22] Filed: Feb. 10, 1981

[30] Foreign Application Priority Data

Feb. 12, 1980 [FR] France ............................. 80 03046

[51] Int. Cl.³ .......................................... H02M 7/10
[52] U.S. Cl. ...................................... 363/61; 361/321; 361/328
[58] Field of Search ................................. 363/59–61; 307/110; 361/321, 328

[56] References Cited

U.S. PATENT DOCUMENTS

| 3,544,925 | 12/1970 | Swart et al. | 333/70 |
| 3,584,287 | 6/1971 | Binoche | 363/61 |
| 3,818,305 | 6/1974 | Dumas | 363/61 |
| 3,900,788 | 8/1975 | Behn | 363/59 |
| 4,313,157 | 1/1982 | Fink | 361/328 |

FOREIGN PATENT DOCUMENTS

| 1587785 | 3/1970 | France . | |
| 2437688 | 4/1980 | France . | |
| 1388112 | 3/1975 | United Kingdom | 363/61 |

Primary Examiner—William H. Beha, Jr.
Attorney, Agent, or Firm—Cushman, Darby & Cushman

[57] ABSTRACT

Integrated voltage multiplier constructed by multilayer technology in the form of a homogeneous block constituted by a stack of thin ceramic dielectric sheets metallized in such a way that each sheet carries metallized zones constituting the foils of capacitors, certain of which are connected in series. Thus, the block has at least two groups of series-connected capacitors. A recess is provided in the block between the two groups for the diodes interconnecting the capacitors of the two groups.

5 Claims, 7 Drawing Figures

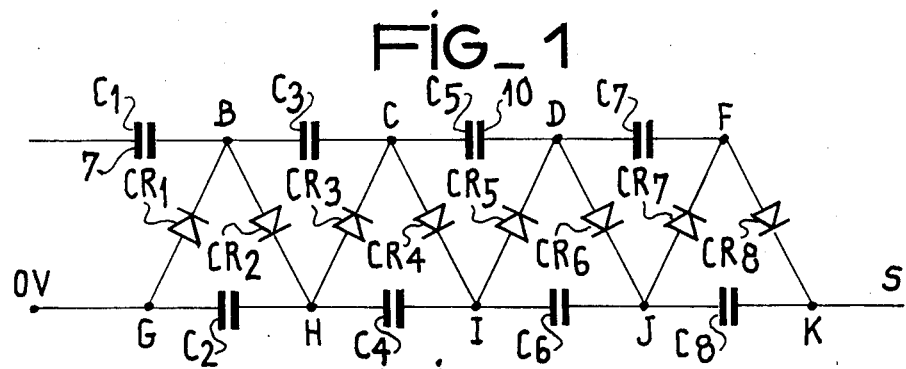
FIG_1
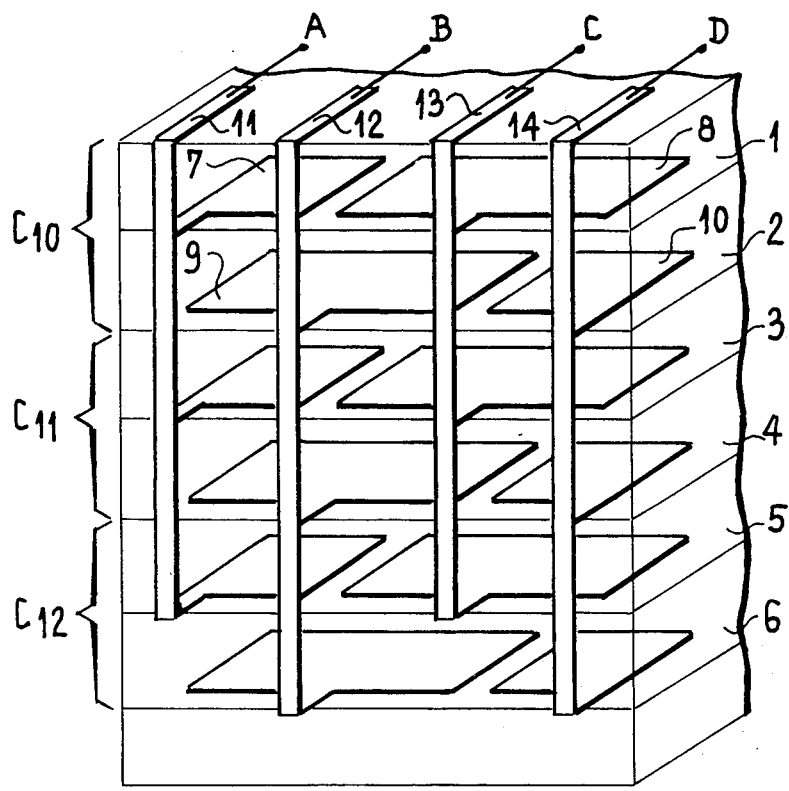
FIG_2
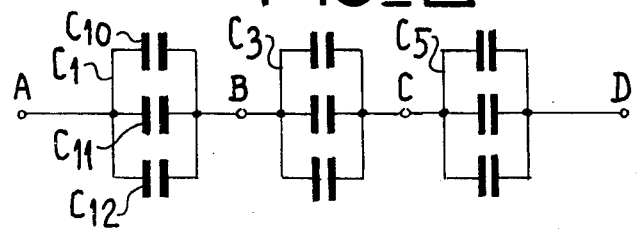
FIG_3

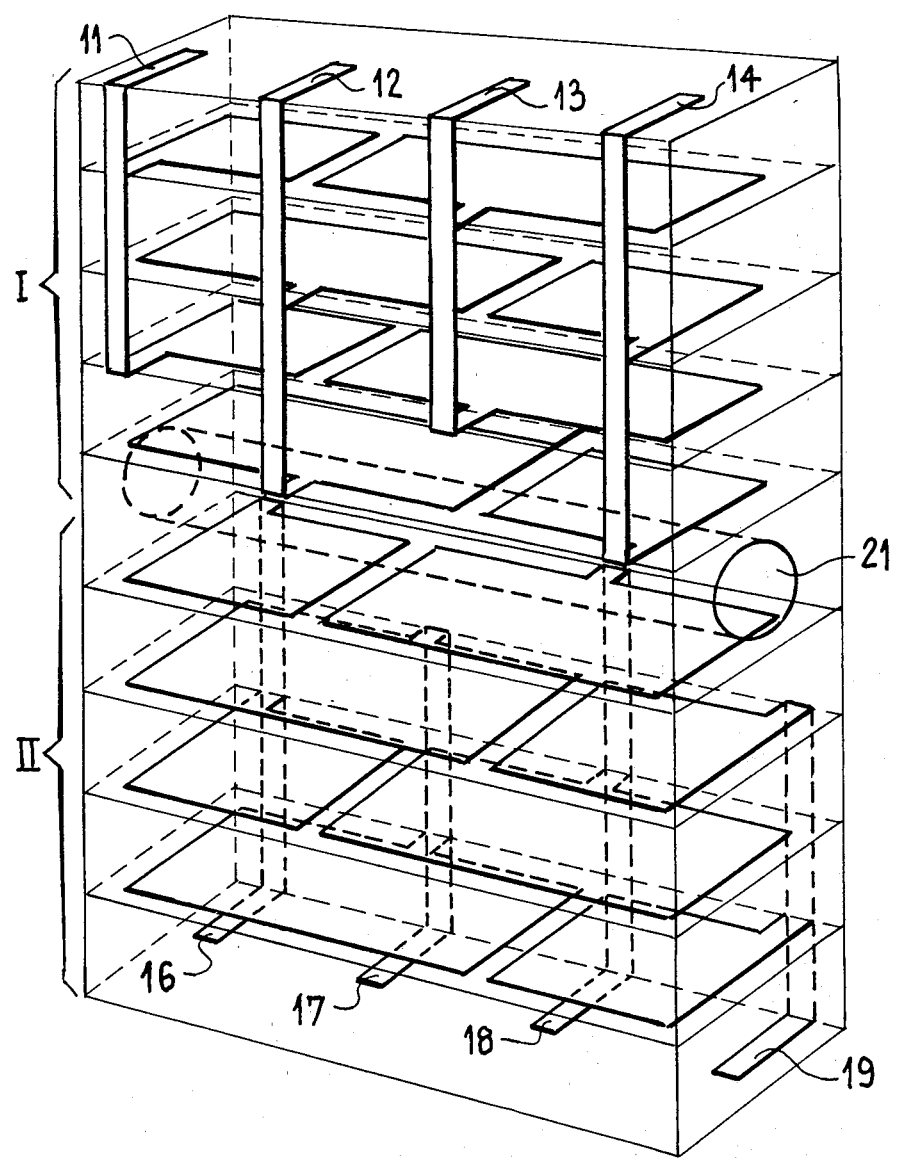
FIG_4

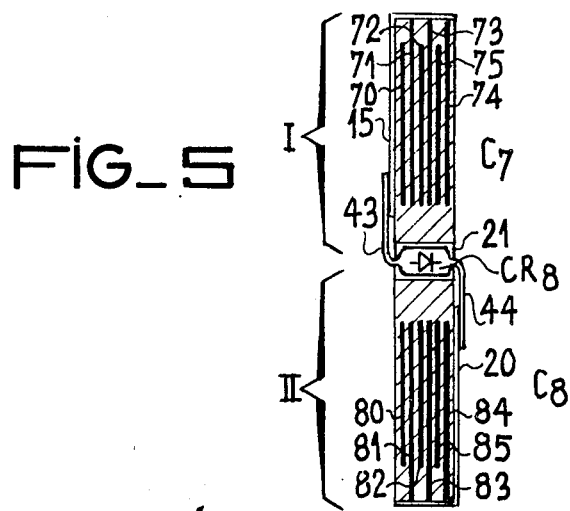
FIG_5
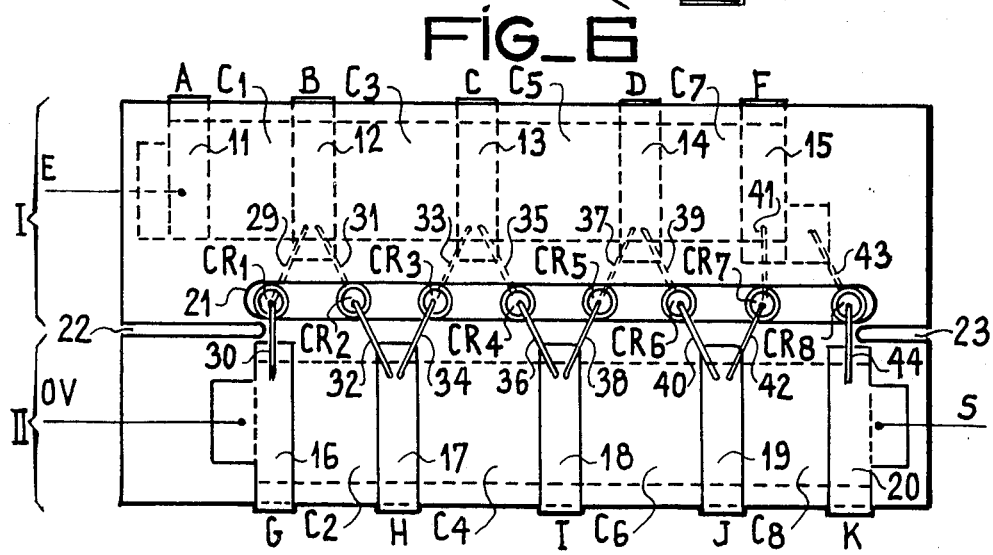
FIG_6
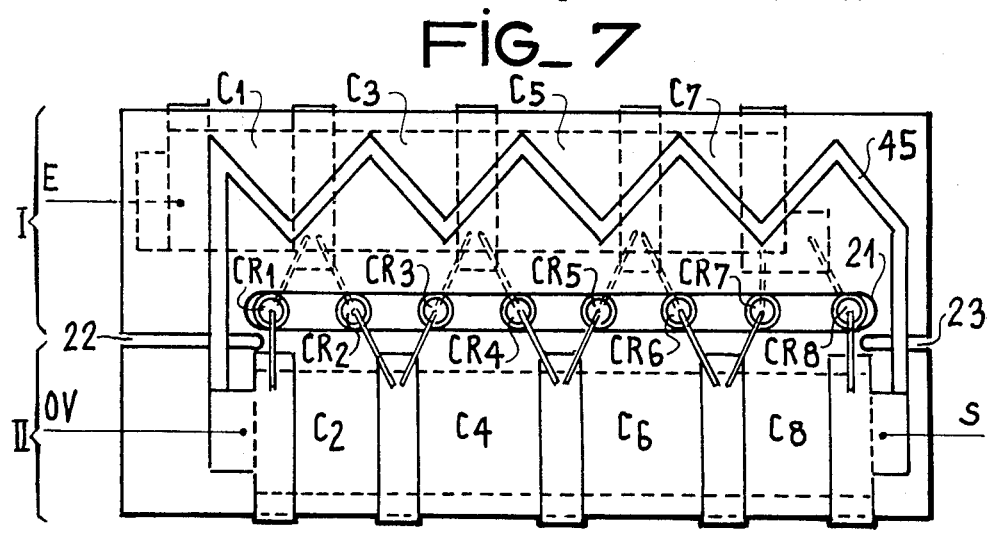
FIG_7

INTEGRATED VOLTAGE MULTIPLIER

BACKGROUND OF THE INVENTION

The present invention relates to integrated voltage multipliers, i.e. the multipliers are constructed on the basis of multilayer technology.

Multistage voltage multipliers, like that shown diagrammatically in FIG. 1, comprise a cascade connection of capacitors and diodes and hitherto they have been constructed in various ways, as a function of the choice of components made.

These components are formed on the one hand by elementary capacitors generally ceramic dielectric capacitors in the form of a monolithic or multilayer disk or have a dielectric film and diodes. These components are arranged in series in the manner shown in FIG. 1, which represents a voltage multiplier known under the name Greinacher circuit. The capacitors used can also be obtained by the metallization of each of the faces of an e.g. ceramic or epoxy insulating plate, so that a series of capacitors is obtained, having similar characteristics with regards to the voltage and supply frequency on the one hand and the voltage and the output power on the other.

Thus, according to the prior art, in the construction of a voltage multiplier, active and passive components are used, which are assembled in accordance with the multiplier circuit diagram, followed by potting. The multiplier is in the form of a block in which various materials are adjacent to one another.

This leads to the disadvantages resulting from the different behaviour of these materials with respect to the climatic conditions. Thus, the glass of the diodes, the copper and lead-tin of the connections and welds, the ceramic or film of the capacitors and the protective resin react very differently to the climatic conditions and aging which, under the influence of the different thermal stresses, lead to changes in the characteristics and a deterioration of the performance levels. Account must also be taken of the very high voltage which, within the block, may cause leakage paths creating short-circuits of multiplier components.

In addition to the aforementioned disadvantages reference must also be made to the overall dimensions and volume occupied by the block forming the multiplier, so that at present the latter has a relatively large size which is not very compatible with what is required for certain applications, such as e.g. the scanning of the radar display, mainly in the case of the embarked version. It is by no means easy to reduce the volume of the presently known voltage multipliers because it would be necessary to take action with respect to the volume of each component, whose sum value, plus the spaces necessary for insulating each of them, gives the total volume of the multiplier unit.

BRIEF SUMMARY OF THE INVENTION

Thus, one object of the invention is to provide a voltage multiplier not having the aforementioned disadvantages.

According to the invention, to reduce the volume of the voltage multiplier action is mainly directed at the capacitors, which are manufactured in the form of a homogeneous block using multilayer technology.

According to the invention, a homogeneous block of series-connected capacitors usable in a voltage multiplier with a multilayer ceramic structure is constructed by successively metallizing thin sheets or films of ceramic dielectric in such a way that each face of a sheet carries a certain number of metallic zones constituting the foils or electrodes of capacitors, said zones being arranged in such a way that every other zone constitutes a foil common to two series-connected capacitors. The thin metallized sheets are stacked in such a way that the foils face one another. A further operation establishes the connections between the different foils in parallel in accordance with the arrangement of said foils following the stacking of the metallized sheets. These connections are formed by the partial external metallization of the block formed as a result of the aforementioned operations. This block constitutes a group of series-connected, integrated capacitors, each capacitor being formed by a certain number of parallel-connected, elementary capacitors.

According to the invention also, a homogeneous block of capacitors arranged in two groups of independent capacitors is constructed according to the so-called multilayer technology.

According to the operation still, there is a supplementary operation consisting of making a recess in the part of the block between two groups of capacitors and which is used for the diodes interconnecting the capacitors of the two groups.

BRIEF DESCRIPTION OF THE DRAWINGS

The invention is described in greater detail hereinafter with reference to non-limitative embodiments and the attached drawings, wherein show:

FIG. 1 a circuit diagram of a multistage voltage multiplier of the Greinacher circuit type.

FIG. 2 a view of a block of capacitors constructed according to the invention.

FIG. 3 the equivalent circuit diagram of the block of FIG. 2.

FIG. 4 a view of the integrated structure of a multiplier of a block of two groups of capacitors constructed according to the invention.

FIG. 5 a circuit diagram of one diode in a block of capacitors.

FIG. 6 a complete integrated voltage multiplier according to the invention.

FIG. 7 a complete integrated voltage multiplier with an also integrated load resistor.

DETAILED DESCRIPTION OF THE PREFERRED EMBODIMENTS

As stated hereinbefore, for numerous uses of voltage multipliers besides eliminating the disadvantages linked with the existing constructions of such multipliers and which are due to the presence in the same block of different materials having different behaviours under the conditions of use causing thermal and/or electrical constraints and with respect to the aging, a miniaturization of the various assemblies is sought.

As multistage voltage multipliers are assemblies of capacitors and diodes, e.g. like that of FIG. 1, and as the total volume of a multiplier is the sum of the volumes of its components, plus the spaces necessary for insulating each component, for miniaturization purposes it appeared appropriate to act on the group of components occupying the largest volume, i.e. the capacitors. If reference is made to FIG. 1, which shows the circuit diagram of a multistage voltage multiplier of the Greinacher circuit type it can be seen that such a multiplier comprises two groups of series-connected capacitors C1,C3,C5,C7 on the one hand and C2,C4,C6,C8 on the other and that diodes CR1,CR2 . . . CR8 are arranged between the two groups of capacitors in such a way that each diode is connected between the two capacitors of each of the groups. A reduction of the volume of each of the groups of capacitors must lead to a reduction of the total volume, the diodes being arranged in the space existing between the two groups of capacitors.

Using multilayer technology, the invention leads to a homogeneous block of capacitors having at least two groups thereof connected in series and which are independent of one another, being mutually arranged in such a way that the space between the two groups of capacitors can be used for housing the interconnected diodes.

FIG. 2 shows in the form of a ceramic block a group of series-connected capacitors constructed in multilayer manner. For manufacturing a group of such capacitors, thin dielectric sheets are used with a thickness of e.g. 20 to 150 $\mu$m having a voltage response/millimeter approximately 5 to 10 times higher than that of solid dielectrics thicker than those presently used for producing capacitors. These thin ceramic dielectric sheets are metallized by means of palladium, silver-palladium, gold-palladium nickel or other metals in such a way that a plurality of capacitors is formed. These capacitors are stacked and compressed so as to give a homogeneous block having in its interior a group of series-connected capacitors. The equivalent circuit diagram is shown in FIG. 3. Each capacitor, i.e. C1,C3 and C5 is constituted by several parallel-connected capacitors, e.g. 3 in the present case. This is because a single capacitor could not have the necessary capacitance. The metallization of each ceramic dielectric sheet such as 1,2 . . . 5,6 consists in the present case of creating two metallic zones 7,8 of different surface area on sheet 1 and 9,10 on sheet 2. Zone 7 appears as a square and zone 8 as a rectangle with a double area. Zone 7 forms a foil of an elementary capacitor, itself constituting the external foil of capacitor C1, designated by the reference numeral 7, whilst the double area zone 8 represents the series arrangement of the foils of capacitor C3 and capacitor C5. In a similar manner, the rectangular zone 9 which has double the area of zone 10 represents the series arrangement of the foils of capacitors C1 and C3, whilst zone 10 represents the right-hand foil of capacitor C5. For example, these arrangements are alternately reproduced on each of the sheets 3, 4, 5 and 6. At the time of stacking the two types of sheets metallized in this way, the foils of the elementary capacitors which will form capacitors C1, C3 and C5 are put in place. Following stacking, i.e. after the ceramic dielectric sheets have been put in place and the capacitors formed, connections are made between the different foils of the elementary capacitors and are brought onto the faces of the block by an external metal coating, as shown in FIG. 2. Metal coating 11 represents the connection between the input terminal A and the first foil of capacitor C1, to the left in FIG. 3. Metal coating 12 represents the connection between the right-hand foil of capacitor C1 and the left-hand foil of capacitor C3 leading to point B. Metal coating 13 represents the connection between the right-hand foil of capacitor C3 and the left-hand foil of capacitor C5 leading to point C. Metal coating 14 represents the connection between the right-hand foil of capacitor C5 and the output terminal of the group of capacitors shown in FIG. 2.

It is obvious that another group of capacitors similar to that of FIG. 2 can be produced in the same way so as to constitute another block of capacitors independent of the first group. The two groups can also be arranged in one and the same block. This block, as shown in FIG. 4, represents in space two series-connected capacitor groups, in the present case the groups of capacitors C1-C3-C5-C7 on the one hand and C2-C4-C6-C8 on the other, with their connections 16, 17, 18 and 19. The positions which can be occupied by the diodes in the block are indicated between blocks I and II. This serves to limit to a maximum the volume of the multiplier. Thus, the block of FIG. 4 only represents an intermediate stage in the manufacture of an integrated multiplier according to the invention. As shown in FIG. 1, the two groups of capacitors are connected by diodes CR1 to CR8. The latter must be arranged between the groups of capacitors in such a way that they are subject to a clearly defined electrical field value, which must be the minimum possible value under the multiplier operating conditions. Although these diodes can be connected correctly in alternating manner to the two groups of capacitors whilst remaining outside the block, according to the invention it is considered to be a better solution to arrange the diodes in a recess provided for this purpose in the blocks of capacitors.

FIG. 6 is a plan view from the side of an integrated voltage multiplier. It is possible to see the first group I of capacitors C1,C3,C5,C7 with the external metal coatings with the terminals A,B,C,D,F, the input terminal E connected to capacitor C1 and the zero voltage terminal OV connected to capacitor C2 of the second group. The second group II of first capacitors C2,C4,C6,C8 is positioned beneath the first group and is slightly displaced with respect thereto and the final capacitor C8 is connected to the output terminal S of the multiplier. The external metal coatings 16, 17, 18 19 and 20, like coatings 11 to 15 of the first group can also be seen therefore and the terminals G,H,I, J and K corresponding to those of FIG. 1 are also shown. For housing, diodes CR1 to CR8 in the block there is a recess 21, whose position between the two groups of capacitors has been selected in the indicated manner, i.e. in a zone where the electric field is not only well defined and stable, but also as low as possible, in such a way that the diodes are all exposed to identical, constant voltages, which may increase their service life. Recess 21 is in the form of a longitudinal slot made in the homogeneous block of capacitors with the diodes fixed and preferably stuck in the slot. To prevent a too high input capacitance and output capacitance, the block has two other narrower slots 22, 23 on either side of slot 21 and whose longitudinal axes are displaced with respect to that of the slot 21. This arrangement makes it possible to bring the input and output capacitances of the multiplier to normal values. This recess can also be in the form of holes, each containing a diode. For the reasons referred to hereinbefore, there is a narrow longitudinal slot in the block.

FIG. 5 diagrammatically shows the arrangement of the diodes in the ceramic dielectric block and which, when viewed edgewise, makes it possible to see a capacitor, e.g. C7 of the first group I and C8 of the second group II by their foils 70 to 75 and 80 to 85. Recess 21 is located between the two capacitors and contains a diode, in the present case CR8, whose terminals are connected to the external metal coatings 15 on the one hand and 19 on the other by connections 43 and 44. As can be clearly seen in FIG. 6, the other diodes respectively placed in slot 21 are connected to the different capacitors of the two groups in accordance with the diagram of FIG. 1. Thus, diode CR1 is connected to the series foils of capacitors C1 and C3 (point B) by its connection 29 and to capacitor C2 (terminal G) by its connection 30. Diode CR2 is connected by its connection 31 to terminal B and by its connection 32 to metal coating 17 (terminal 4). The same applies for the following diodes CR3,CR4,CR5,CR6 and CR7 using connections 33-34; 35-36; 37-38; 39-40; 41-42. The diode-receiving recess 21 is made during the production of the homogeneous block when the ceramic material is still pasty. This is better than machining the finished block and in particular obviates any risk of microcracks.

FIG. 7 is a complete view of the integrated voltage multiplier according to the invention incorporating a high impedance load resistor 45 obtained during a prefinal operation by depositing a resistive layer on one of the faces of the block. This resistor is used as an attenuating measuring bridge and discharge bleeder. Moreover, the insulation between the different points of the resistor and the different parts of the multiplier is reduced, the parts present being substantially at the same potential.

The final operation in the manufacture of the integrated multiplier consists of covering the block with a fine layer of silicone, epoxy or enamel.

Thus, the manufacturing process of an integrated voltage multiplier by the multilayer process has been described, together with the multiplier and the block of capacitors obtained in this way. Reference will now be made to the advantages obtained. A block of capacitors of dimensions 50×25×3 can comprise two series of four capacitors with a unit value of 2.5 nF with a mains voltage of approximately 2.5 kV. A complete integrated assembly of dimensions 75×25×3 is able to supply an output voltage of approximately 20 kV occupying a volume 4 to 6 times less than the volume of a prior art multiplier with the same performance characteristics. In addition to this volume reduction, the integrated multiplier has a better voltage and thermal stability. As the dielectric and operating procedure are the same for all the capacitors, the variations are in the same direction and of the same value, the diodes being exposed to identical, constant voltages.

It should be noted that the capacitance tolerance is better than +5%. As the potted coating consists of a thin resin film, the random stresses causing defects are reduced. The connections are reduced to the minimum and the simplification of their configuration tends to eliminate interference fields and increases reliability. Moreover, it is easy to obtain different capacitances in the same block. Finally, the reproducibility of manufacture is ensured.

Such integrated multipliers are more particularly used where particular importance is attached to miniaturization, service life and reliability. Examples of such uses are the scanning equipment for embarked radar displays, portable television cameras and oscilloscopes.

What is claimed is:

1. An integrated voltage multiplier made in accordance with multilayer technology as a monolithic block comprised of at least two independent groups of series-connected capacitors with diodes interconnecting the capacitors of said two groups, comprising a stack of metallized sheets with metallized parts arranged so that capacitors are formed which are series-connected, means defining at least first, second and third slots between said groups, said first and second slots adjusting the input and output capacitance of said multiplier and a plurality of diodes housed in said third slot for interconnecting the capacitors of said groups.

2. A voltage multiplier as claimed in claim 1, wherein said slot is formed as a plurality of holes between said groups of capacitors for housing therein diodes interconnecting said capacitors of said groups.

3. An integrated voltage multiplier made in accordance with multilayer technology as a monolithic block comprised of at least two independent groups of series-connected capacitors with diodes interconnecting the capacitors of said two groups, comprising a stack of metallized sheets with metallized parts arranged so that capacitors are formed which are series-connected, means defining at least one slot between said groups, a plurality of diodes housed in said slot for interconnecting the capacitors of said groups, and a load resistor formed on a face of said block by depositing a resistive layer thereon in accordance with the so-called thick layer technology, said resistor being formed in an S-shape so as to provide an attenuating bridge to maintain the different parts of the multiplier and the resistor at the same potential.

4. A method for making an integrated voltage multiplier as a monolithic block of at least two independent groups of series connected capacitors with diodes interconnecting the capacitors of said groups, comprising the steps of:
successively metallizing thin sheets of ceramic dielectric for providing on each face thereof metallized parts of different dimensions;
placing said sheets in stacked relationship with a face of one sheet facing a face of another sheet, said metallized parts forming electrodes of capacitors and every other metallized part on a face further forming an electrode common to two series-connected capacitors;
partially and externally metallizing the assembly obtained from the preceding steps to provide connections between different electrodes;
combining two assemblies as defined in the preceding steps to form the block;
making in the space provided between said assemblies at least first, second and third slots extending over at least part of said block, said first and second slots adjusting the input and output capacitance of said multiplier;
housing diodes in said third slot for interconnecting the capacitors of each of said assemblies;
forming the input and output connections of said block;
forming on a face of said block a load resistor by depositing a resistive layer by thick layer technology; and
depositing a thin layer of a material chosen from the group consisting of silicone, epoxy or enamel on said block.

5. A method as claimed in claim 4, comprising the step of making holes in the space between said assemblies, each hole housing a diode interconnecting two capacitors, one in each assembly.

* * * * *